(12) United States Patent
Barizza et al.

(10) Patent No.: US 9,321,540 B2
(45) Date of Patent: Apr. 26, 2016

(54) FLIGHT DATA RECORDER
(71) Applicant: AIRBUS OPERATIONS SAS, Toulouse (FR)
(72) Inventors: Laurent Barizza, Plaisance du Touch (FR); Frederic Aubespin, Cugnaux (FR)
(73) Assignee: Airbus Operations SAS, Toulouse (FR)
( * ) Notice: Subject to any disclaimer, the term of this patent is extended or adjusted under 35 U.S.C. 154(b) by 231 days.
(21) Appl. No.: 14/132,202
(22) Filed: Dec. 18, 2013
(65) Prior Publication Data
 US 2014/0177146 A1    Jun. 26, 2014
(30) Foreign Application Priority Data
 Dec. 20, 2012   (FR) ...................................... 12 62429
(51) Int. Cl.
 *B64D 25/20* (2006.01)
 *G08B 5/40* (2006.01)
 *B64D 45/00* (2006.01)
 *G07C 5/08* (2006.01)
 *H05K 5/02* (2006.01)
(52) U.S. Cl.
 CPC ................ *B64D 45/00* (2013.01); *B64D 25/20* (2013.01); *G07C 5/0858* (2013.01); *H05K 5/0213* (2013.01); *B64D 2045/0065* (2013.01)
(58) Field of Classification Search
 CPC .......... B64D 25/20; G08B 5/00; G08B 5/002; G08B 5/02; G08B 5/40; H05K 5/06
 USPC ................................................... 116/211, 32
 See application file for complete search history.

(56) References Cited

U.S. PATENT DOCUMENTS

| | | | |
|---|---|---|---|
| 2,192,450 A | 3/1940 | Miller | |
| 2,474,537 A | 6/1949 | MacLeod | |
| 2,836,143 A | 5/1958 | William | |
| 3,043,263 A * | 7/1962 | Klopp .................... | B64D 25/20 116/211 |
| 3,140,847 A | 7/1964 | Ames, Jr. | |
| 3,157,890 A * | 11/1964 | Mellon, Jr. ............. | B63B 22/12 116/211 |
| 3,313,268 A * | 4/1967 | Reiffel ................... | G08B 5/002 116/211 |
| 3,319,596 A | 5/1967 | Neal | |
| 3,768,436 A * | 10/1973 | Martini .................. | F42B 19/36 114/20.1 |
| 3,859,680 A * | 1/1975 | Larsen .................... | B63B 51/00 116/211 |
| 3,874,326 A * | 4/1975 | Pickens .................. | B64D 25/20 116/211 |
| 4,080,677 A * | 3/1978 | Koehler .................. | B63C 11/26 116/211 |
| 4,376,421 A * | 3/1983 | Skinner .................. | G08B 5/40 116/211 |
| 5,405,416 A * | 4/1995 | Swinton .............. | C09B 67/0072 116/211 |
| 6,129,036 A * | 10/2000 | King et al. .............. | B63C 9/155 116/206 |
| 6,153,720 A * | 11/2000 | Olzak et al. .......... | H05K 5/0213 528/182 |
| 6,260,508 B1 * | 7/2001 | Morse .................... | G08B 5/002 116/211 |
| 7,208,685 B2 * | 4/2007 | Browning et al. ..... | G07C 5/085 174/544 |

FOREIGN PATENT DOCUMENTS

WO   WO 2009/137745   11/2009

OTHER PUBLICATIONS

Search Report for FR 20120062429 dated Oct. 8, 2013.

* cited by examiner

*Primary Examiner* — Richard A Smith
(74) *Attorney, Agent, or Firm* — Nixon & Vanderhye P.C.

(57) ABSTRACT

The invention relates to a flight data recorder. It is equipped with capsules designed to break at determined depths. The capsules release hydraulic tracing elements, generating a luminous streak in the water, when they are broken, so that the searches for the flight data recorders, or black boxes, are made easier.

12 Claims, 4 Drawing Sheets

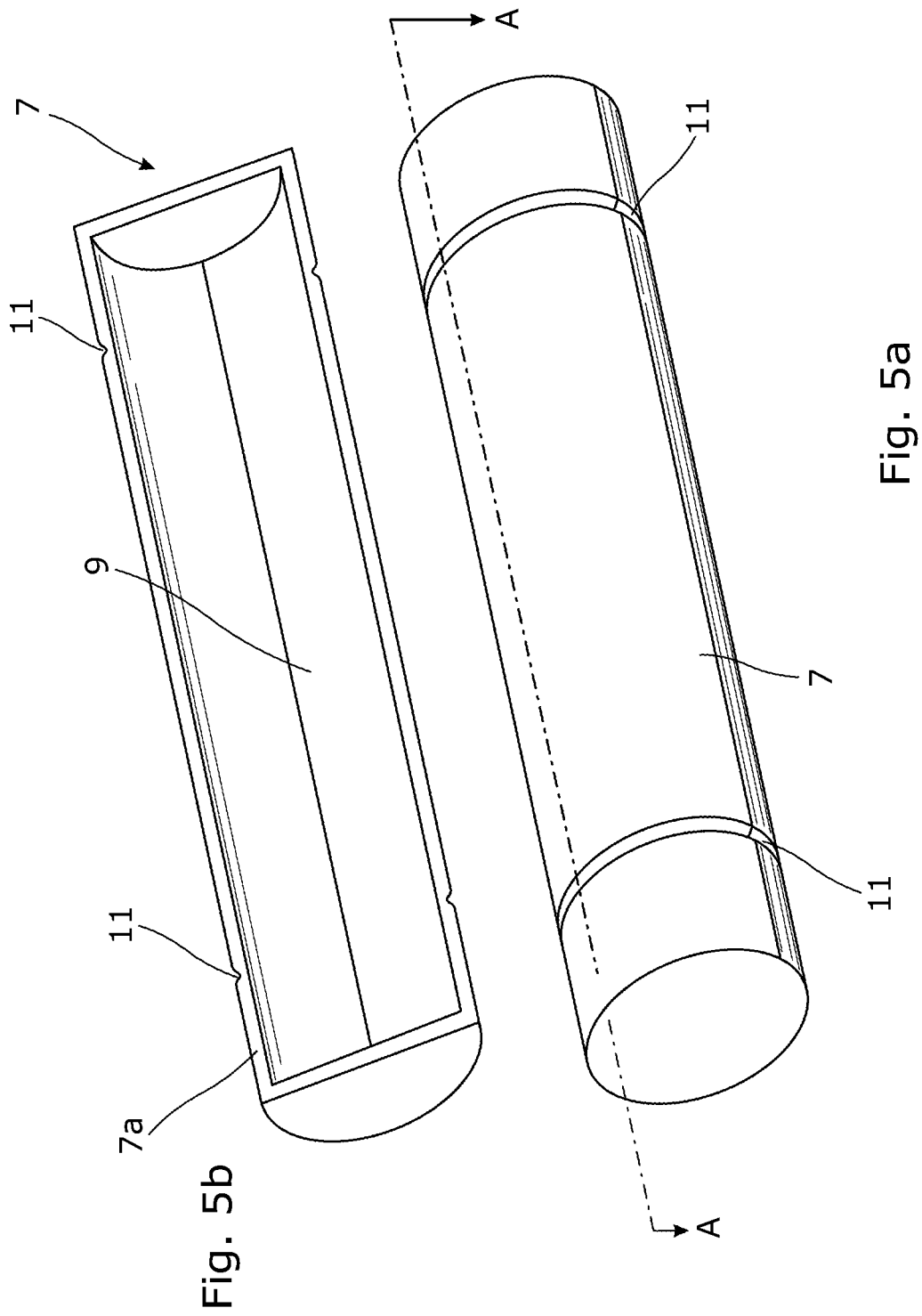

FLIGHT DATA RECORDER

BACKGROUND OF THE INVENTION

This application claims priority to French Patent Application No. 20120062429 filed 20 Dec. 2012, the entire contents of which are hereby incorporated by reference.

1. Field of the Invention

The present invention relates to a flight data recorder, more commonly called black box.

2. Discussion of Prior Art

With reference to FIG. 1, a flight data recorder 1 comprises a frame 2, a recorder 3 and a ULB beacon 4 (ULB standing for Underwater Locator Beacon). The recorder 3 is fixed to the frame 2 and the ULB beacon 4 is fixed to the recorder 3. The recorder 3 and the frame 2 both incorporate various electronic elements intended for the operation of the flight data recorder.

A flight data recorder is usually placed in the rear part of the fuselage of an aircraft because that is the part whose integrity is best retained when an aircraft impacts with the sea. A flight data recorder can, however, be separated from this part of the fuselage when the impact of the aircraft with the sea is violent, or when the aircraft fuselage is broken up before the latter impacts with the sea. In these cases, the search operations for the flight recorders are long and tedious because they entail first defining an approximate position of the rear part and searching a radius of several hundred meters around this approximate position.

The approximate position of the rear part is computed from uncertain parameters, such as the last assumed trajectory of the aircraft, the analysis of the underwater currents or the analysis of the drift of floating debris.

In order to speed up the search, all flight data recorders are colored orange or red, and fluorescent in the dark. Furthermore, the ULB beacon is triggered on immersion and emits an omnidirectional signal.

It will be understood that the computed approximate position of the rear part must be as close as possible to its real position because, on the one hand, the color of the flight data recorders may be difficult to see at a distance in great depths or when the water is disturbed and, on the other hand, the omnidirectional signal may be difficult to pick up when the underwater relief is steep. In the latter case, the detection of the signal is then possible only in an area close to the flight recorders.

SUMMARY OF THE INVENTION

The present invention aims to allow for an accurate estimation of the position of the flight recorders of an aircraft which is sunk at sea.

To this end, the invention relates to a flight data recorder comprising a frame-, a recorder, and at least one case having one or more housings, each case housing having a capsule inserted therein, each capsule having a body which is substantially cylindrical, the body defining a leak-tight housing containing a volume of air at a predefined pressure and a hydraulic tracing element, the body of each capsule comprising at least one compression mode rupture zone, wherein each case housing is arranged into the case along its entire length between a first end and a second end of the case, a plurality of through openings being arranged on the case.

Thus, when the flight data recorder is immersed in water, each capsule is subject to the pressure of the ambient water which compresses it. When the compression forces exerted on the column of water on the capsule are too great and are no longer compensated by the internal pressure, the structure of the capsule breaks at embrittlement elements and the hydraulic tracing element is dispersed in the water and escapes out of the housing. A streak of color that can be detected by optical instruments of the search teams is then visible in the water and/or on the surface of the water. The depth at which the capsule breaks is determined accurately as a function of the internal pressure, of the material, of the thickness of the capsule and of the form of the embrittlement elements. It is then possible to obtain an accurate indication of the depth at which the flight data recorder is located when a streak of color is detected, by the vessels (airplanes, ships, submarines) of the search teams.

According to the present invention, each case comprises at least one housing passing through the case between a first end and a second end, the at least one capsule being inserted into the at least one case housing, a plurality of through openings being arranged on the case.

BRIEF DESCRIPTION OF THE DRAWINGS

The invention will now be described by way of example with reference to the appended drawings, in which:

FIG. 5a is a perspective view of a capsule of the case according to an embodiment of the invention;

FIG. 5b is a perspective view of a cross section of a capsule along the plane A-A of FIG. 5a.

DETAILED DISCUSSION OF EMBODIMENTS

In all these figures, identical references designate identical or similar elements.

Figure 1:
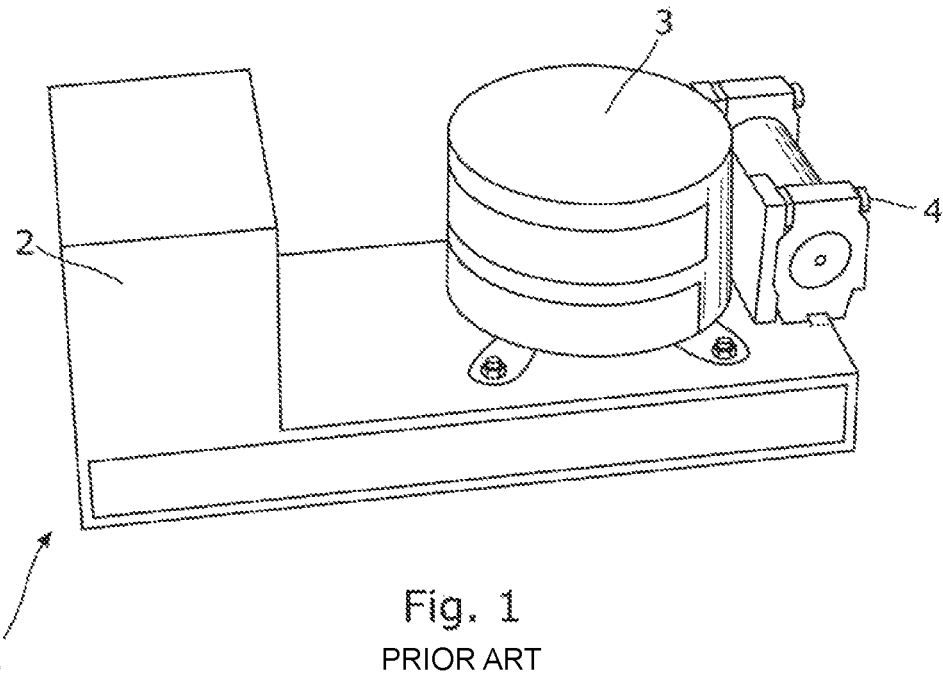
FIG. 1 is a perspective view of a flight data recorder according to the prior art.
Figure 2:
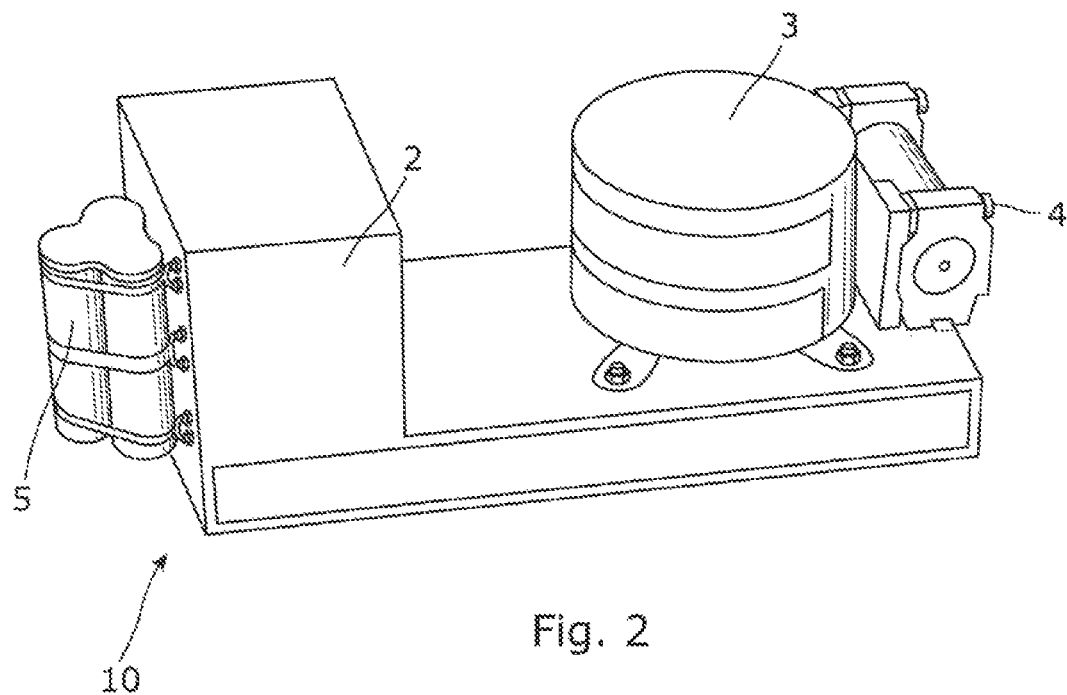
FIG. 2 is a perspective view of a flight data recorder according to an embodiment of the invention.

With reference to FIG. 2, a flight data recorder 10 of the invention is described. The flight data recorder 10 comprises a frame 2, a recorder 3, a ULB beacon 4 and a case 5. The recorder 3 is fixed to the frame and the ULB beacon 4 is fixed to the recorder 3. In the example of FIG. 2, the case 5 is fixed to the frame 2. The fixing of the case 5 is effected using any means known to a person skilled in the art, for example using metal hoops screwed onto the frame and securing the case 5.

Figure 3:
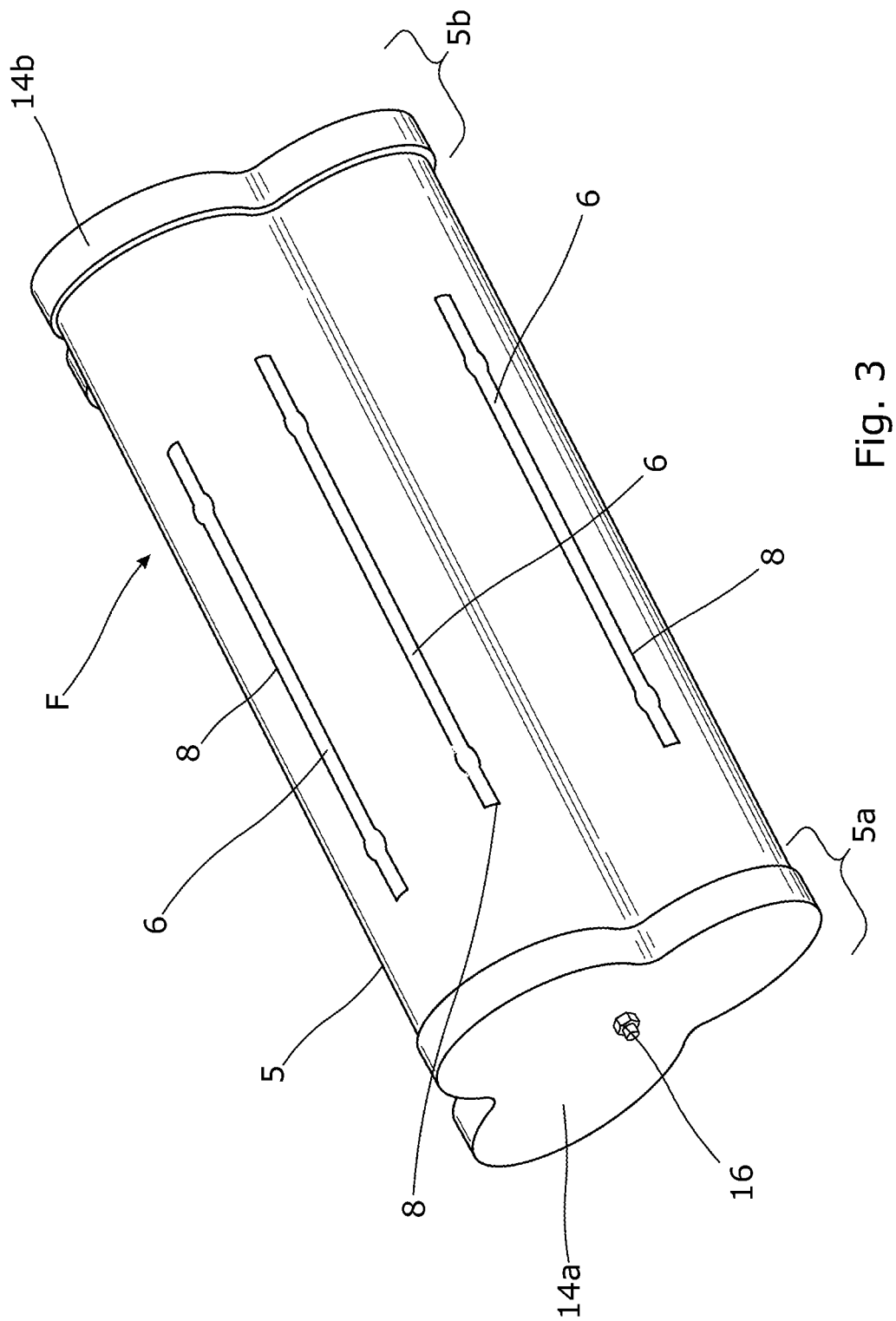
FIG. 3 is a perspective view of a case of the flight data recorder according to an embodiment of the invention.

As can be seen in the example illustrated in FIG. 3, the case 5 comprises three housings 6 (only two are represented in FIG. 3) into each of which is inserted a capsule (not represented in FIG. 3). A plurality of through openings 8 are arranged on the case 5.

A housing 6 has dimensions such that, when a capsule is inserted therein, water can freely circulate between the internal wall of the case and the external wall of the capsule. For example, when the capsule is cylindrical, the space left free between the outer wall of the capsule and the inner wall of the case is of the order of 0.1 times to 0.50 times the diameter of the outer wall of the capsule.

Figure 4:
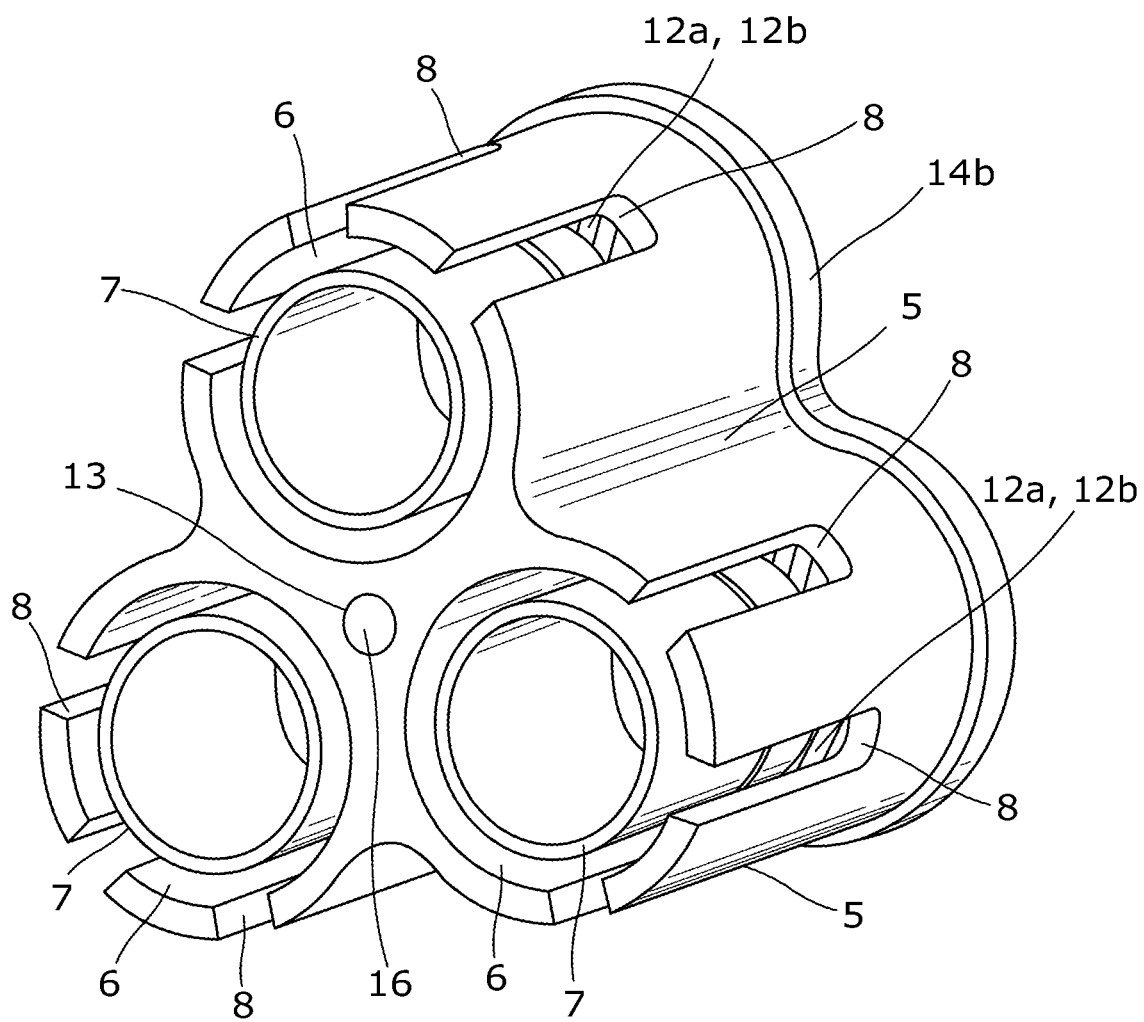
FIG. 4 is a larger scale view of the case according to the arrow F of FIG. 3.

In the example illustrated in FIGS. 3 and 4, the case 5 comprises three housings 6, which are formed in the case 5, over its entire length. The housings 6 are cylindrical. This preferential form of the housings 6 makes it possible to connect a first part 12a and a second part 12b, both cylindrical, made of flexible plastic at each end of a capsule 7 which is inserted into a housing 6. Each part 12a, 12b made of flexible plastic has a diameter close to that of a housing 6, such that their movement in a housing 6 is limited by significant friction forces. The role of these parts 12a, 12b is thus to reduce the impacts inflicted on the capsules 7 by limiting their movement in a housing 6.

Preferably, the three cylindrical housings 6 are evenly distributed around a bore 13 passing through the length of the case. This distribution makes it possible, when the case is immersed, for the pressure of the water to be exerted uniformly on the three capsules 6. The case 5 is closed at its first end 5a by a first cap 14a comprising a screw thread and at its second end 5b by a second cap 14b. A stud 16 is slid into the bore 13; the threaded end of the stud 16 is screwed to the screw thread of the first cap 14a and the second end of the stud 16 comprises a head that presses on the second cap 14b, thus keeping the latter fixed to the second end 5b of the case 5. The movement of the parts 12a, 12b and, consequently, of the capsules 7, is thus immobilized in the housings 6.

With reference to FIGS. 5a and 5b, the capsule 7 comprises a body 7a, preferably substantially cylindrical. The body 7a defines a leak-tight housing 9.

The leak-tight housing 9 encloses a volume of air and a hydraulic tracing element which is water-soluble. The hydraulic tracing element and the volume of air are in contact with one another.

The volume of air has a predefined pressure, called internal pressure of the capsule, greater than 1 bar and that can range up to a few hundred bar.

The internal pressure exerts a radial force, directed outward, on the inner wall of the capsule 7. In order to withstand this force, the body 7a of the capsule 7 has a rigid structure. The rigid structure of the body 7a of the capsule is preferably produced in a material of steel, aluminum or carbon fiber type, or in any other material that has a Young's modulus greater than 60 GPa.

The hydraulic tracing element is preferably in powder form. It is chosen from the hydraulic tracers that are commonly employed such as fluorescein, sodium naphthionate or eosine YB. Fluorescein is known to emit a reflected light of dayglo green fluorescence, sodium naphthionate to emit a reflected light of violet blue fluorescence and eosine YB to emit a reflected light of orange-yellow fluorescence.

A capsule 7 is filled with air and with hydraulic tracing element for example by means of a valve arranged on the body 7a of the capsule 7.

At least one, preferably two compression mode rupture zones 11 as illustrated in FIG. 5a, are arranged on the capsule 7. In a rupture zone 11, the resistance of the structure of the body 7a of the capsule 7 to compression is reduced. A rupture zone can be of different kinds, but preferably, and as illustrated in FIG. 5a, it is a groove, for example V-shaped, describing a closed flat curve in a radial plane of the cylindrical surface of the body 7a of the capsule 7.

The locating of the flight data recorder 10 of the invention, when the latter is immersed, will now be described in relation to the embodiment illustrated in FIGS. 3 and 4.

A first capsule contains eosine YB powder and a volume of air at a pressure of the order of 1 bar, the second capsule contains sodium naphthionate powder and a volume of air at a pressure of the order of 10 bar and the third capsule contains a fluorescein powder and a volume of air at a pressure of the order of 100 bar.

The pressure of 1 bar corresponds to the pressure at a water depth of 10 m, 10 bar to a water depth of 100 m, 100 bar to a water depth of 1000 m.

Computation programs make it possible to accurately compute the characteristics of the capsule (material, thickness, depth and width of the groove or grooves formed on the external wall of the capsule) and the internal pressure prevailing in the capsule in order for the body of the capsule to break, at its rupture zones, at the desired depth.

In this example, the first capsule is designed to break at a depth of the order of 10 m, the second capsule at a depth of the order of 100 m, and the third capsule at a depth of the order of 1000 m.

Other pressures and hydraulic tracing elements can be chosen without departing from the framework of the invention.

When the flight data recorder 10 is immersed, water will penetrate through the openings 8 of the case 5 and will exert a pressure on the three capsules 7, which are thus compressed. The first capsule will withstand the compression up to a depth on the order of 10 m, then, beyond this depth, the pressure of the internal volume of the first capsule will no longer be sufficient to compensate for the pressure exerted by the column of water. When the compression force being exerted on the first capsule is too great, the body of the first capsule breaks at the rupture zones 11 and the eosine YB powder spreads in the water. The flight data recorder 10 then trails a persistent orange-yellow fluorescent streak in its wake.

If the flight recorder sets down on a sea bed relief at a depth less than 100 m, then only the first capsule breaks. The persistent streak left by the flight recorder, which will trail on the surface according to the currents, will enable the search teams to locate the flight recorder and to know that the recorder is situated at a depth of less than 100 m. In practice, the persistent orange-yellow fluorescent streak can be detected at a great distance on the surface using optical means installed on the vessels (aircraft, ships) of the search teams.

If the sea bed is situated at a depth greater than 100 m, according to the same principle, the body of the second capsule will break, at its rupture zone, beyond a depth of 100 m and trail a violet blue streak in addition to the orange-yellow streak. The search teams will be able, using optical means and by following the trace of the first streak, to locate the violet blue streak and thus determine that the flight data recorder 10 is situated at a depth greater than 100 m. The second streak may, if the sea currents are favorable, also be located on the surface of the sea which gives a much faster indication of depth to the rescue team.

It will be understood that this same scheme applies for the third capsule which will emit a dayglo green streak if the flight recorder sets down on a sea bed at a depth greater than 1000 m.

The advantage of the invention is that it enables the search teams to quickly know the position of a flight data recorder by virtue of the first streak, then to find the depth of the beacon via the possible second and third streaks. Knowing an estimation of the depth of the flight data recorder of the invention enables the search teams to position the receivers of the signal emitted by the ULB beacon as close as possible thereto, which considerably increases the chances of retrieving the flight data recorder.

Hydrological tracers have demonstrated, in the mining and geological field, their great persistence, their strong dispersion capability and the facility to identify them even at low concentrations, and to do so in day time and night time, using suitable optical means.

In a first variant embodiment of the invention not represented in the figures, the case 5 is directly fixed to the recorder 3 and not to the frame 2.

In a second variant embodiment of the invention not represented in the figures, the case 5 is contained in a box fixed to the frame of the flight data recorder 10 of the invention. This box comprises a plurality of openings for water to pass through.

In a third variant embodiment of the invention not represented in the figures, a plurality of cases 5, each comprising at least one capsule 7, are fixed to the frame 2 and/or to the recorder 3.

In a first variant, not represented in the figures, of the example of the rupture zone 11 illustrated in FIG. 5a, a rupture zone 11 is a groove, for example V-shaped, describing a closed flat curve in a longitudinal plane of the cylindrical surface of the body 7a of the capsule 7.

In a second variant not represented in the figures, a rupture zone 11 is created by a removal of material over a localized area of the cylindrical surface of the body 7a of the capsule 7, so as to create a thickness difference.

The case (or the box containing the case) can be fixed from the design stage of the flight recorder, or be added onto a recorder after its design during a retrofit of the safety elements of an aircraft.

The invention claimed is:

1. A flight data recorder comprising:
a frame,
a recorder, and
one or more cases, each case having one or more housings,
one or more capsules, each capsule being inserted in a corresponding one of the one or more case housings,
each capsule having a body which is substantially cylindrical and defines a leak-tight housing containing a volume of air at a predefined pressure which determines a predetermined pressure externally compressing the capsule at which the capsule ruptures and a hydraulic tracing element, and comprises at least one compression mode rupture zone,
each case housing being arranged in the case along its entire length between a first end and a second end of the case, a plurality of through openings being arranged on the case,
wherein in each capsule when pressure externally compressing the capsule is greater than the predefined pressure of the volume of air in the capsule, the capsule ruptures to thereby releases the hydraulic tracing element.

2. The flight data recorder as claimed in claim 1, wherein the compression mode rupture zone is a groove.

3. The flight data recorder as claimed in claim 1, wherein the hydraulic tracing element is chosen from the following elements: fluorescein, sodium naphthionate or eosine YB.

4. The flight data recorder as claimed in claim 1, wherein the pressure externally compressing the capsule is provided by a depth of water in which the capsule is immersed.

5. The flight data recorder as claimed in claim 1, wherein the pressure externally compressing the capsule is provided by a depth of fluid in which the capsule is immersed.

6. A flight data recorder comprising:
a frame,
a recorder, and
one or more cases, each case having one or more housings,
one or more capsules, each capsule being inserted in a corresponding one of the one or more case housings,
each capsule having a body which is substantially cylindrical, defines a leak-tight housing containing a volume of air at a predefined pressure and a hydraulic tracing element, and comprises at least one compression mode rupture zone,
each case housing being arranged in the case along its entire length between a first end and a second end of the case, a plurality of through openings being arranged on the case, and
wherein the case comprises a first capsule, a second capsule and a third capsule inserted respectively into a first case housing, a second case housing and a third case housing, the leak-tight housing of the first capsule containing a first volume of air at a first pressure, a first hydraulic tracing element and a first water-soluble fluorescent element, the leak-tight housing of the second capsule containing a second volume of air at a second pressure, a second hydraulic tracing element and a second water-soluble fluorescent element, the leak-tight housing of the third capsule containing a third volume of air at a third pressure, a third hydraulic tracing element and a third water-soluble fluorescent element, the first, second and third pressures being different from one another and the first, the second and the third hydraulic tracing elements being different from one another.

7. The flight data recorder as claimed in claim 6, wherein the first, second and third case housings are each substantially cylindrical with a first diameter, the movement of each of the first, second and third capsules in the first, second and third case housings, respectively, being limited by corresponding first and second cylindrical parts arranged respectively at corresponding first and second ends of the respective one of the first, second and third capsules and inserted respectively into the first, second and third case housings, the diameters of each of the first and second cylindrical parts being substantially equal to the first diameter.

8. The flight data recorder as claimed in claim 6, wherein the three case housings are evenly distributed around a bore passing through the case from the first end of the case to the second end of the case, the case being closed at its first end by a first cap comprising a screw thread and at its second end by a second cap, a stud being arranged in the bore, a first end of the stud being screwed to the screw thread of the first cap and the second end of the stud securing the second cap at the second end of the case.

9. The flight data recorder as claimed in claim 6, wherein the volume of air at a predefined pressure which determines a predetermined depth in water at which the capsule ruptures, such that in each capsule when water pressure at the predetermined depth in water is greater than the predefined pressure of the volume of air in the capsule, the capsule ruptures to thereby releases the hydraulic tracing element.

10. An aircraft flight data recorder comprising:
a frame,
a recorder mounted on the frame, and
one or more capsules mounted on the frame,
the one or more capsules each comprising a body,
each body defining a leak-tight housing containing both a volume of air at a predefined pressure which determines a predetermined depth in water at which the capsule ruptures and a hydraulic tracing element, each body including at least one compression mode rupture zone,
wherein, when each capsule is immersed to the predetermined depth in water corresponding to the capsule, the water pressure at the corresponding predetermined depth is greater than the predefined pressure of air in the capsule, causing the capsule to rupture, thereby releasing the hydraulic tracing element.

11. A flight data recorder comprising:
a frame,
a recorder, and
one or more cases, each case having one or more housings, one or more capsules, each capsule being inserted in a corresponding one of the one or more case housings, each capsule having a body which is substantially cylindrical and defines a leak-tight housing containing a volume of air at a predefined pressure which determines a predetermined depth in fluid at which the capsule ruptures and a hydraulic tracing element, and comprises at least one compression mode rupture zone, each case housing being arranged in the case along its entire length between a first end and a second end of the case, a plurality of through openings being arranged on the case, wherein in each capsule when fluid pressure at the predetermined depth in fluid is greater than the predefined pressure of the volume of air in the capsule, the capsule ruptures to thereby releases the hydraulic tracing element.

12. The flight data recorder as claimed in claim 11, wherein the fluid is water in which the capsule is immersed.

* * * * *